United States Patent [19]

Ohguro

[11] Patent Number: 5,840,626
[45] Date of Patent: Nov. 24, 1998

[54] SEMICONDUCTOR DEVICE AND METHOD OF MANUFACTURING THE SAME

[75] Inventor: Tatsuya Ohguro, Yokohama, Japan

[73] Assignee: Kabushiki Kaisha Toshiba, Kawasaki, Japan

[21] Appl. No.: 722,324

[22] Filed: Sep. 27, 1996

[30] Foreign Application Priority Data

Sep. 28, 1995 [JP] Japan ................................ 7-250420
Sep. 18, 1996 [JP] Japan ................................ 8-266614

[51] Int. Cl.$^6$ .................................................. H01L 21/4763
[52] U.S. Cl. ........................ 438/649; 438/651; 438/655; 438/64
[58] Field of Search .......................... 437/200; 438/624, 438/631, 635, 637, 644, 655, 656, 651, 664

[56] References Cited

U.S. PATENT DOCUMENTS

| | | | |
|---|---|---|---|
| 5,108,953 | 4/1992 | Tateiwa | 437/200 |
| 5,217,923 | 6/1993 | Suguro | 437/200 |
| 5,567,651 | 10/1996 | Berti et al. | 437/200 |
| 5,624,869 | 4/1997 | Agnello et al. | 438/602 |
| 5,654,237 | 8/1997 | Suguro et al. | 438/624 |

FOREIGN PATENT DOCUMENTS

| | | |
|---|---|---|
| 62-76560 | 4/1987 | Japan . |
| 2-162723 | 6/1990 | Japan . |
| 2-197121 | 8/1990 | Japan . |

*Primary Examiner*—Charles L. Bowers, Jr.
*Assistant Examiner*—Reneé R. Berry
*Attorney, Agent, or Firm*—Oblon, Spivak, McClelland, Maier & Neustadt, P.C.

[57] ABSTRACT

A method of manufacturing a semiconductor device comprises the steps of forming a first metal film including a first metal on a surface of a silicon film by sputtering using a gas mixture added with a nitrogen gas, the first metal being one of nickel and cobalt, and causing thermal reaction of the silicon film with the first metal film to form a silicide film of the first metal.

21 Claims, 15 Drawing Sheets

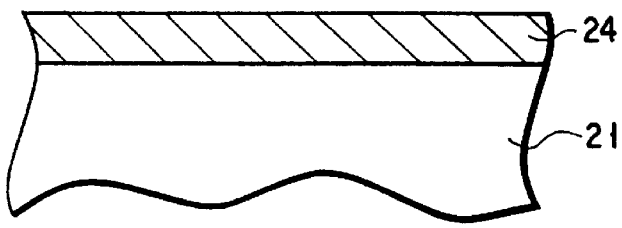
F I G. 3C
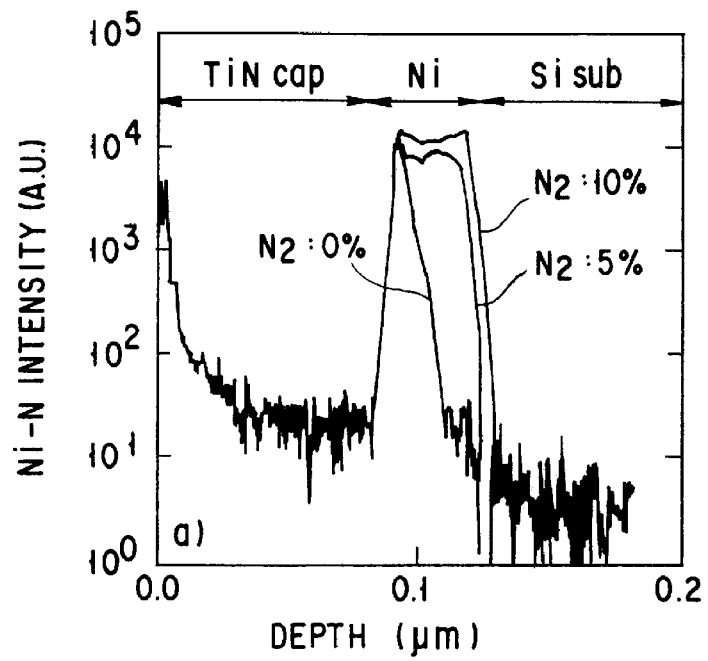
F I G. 4
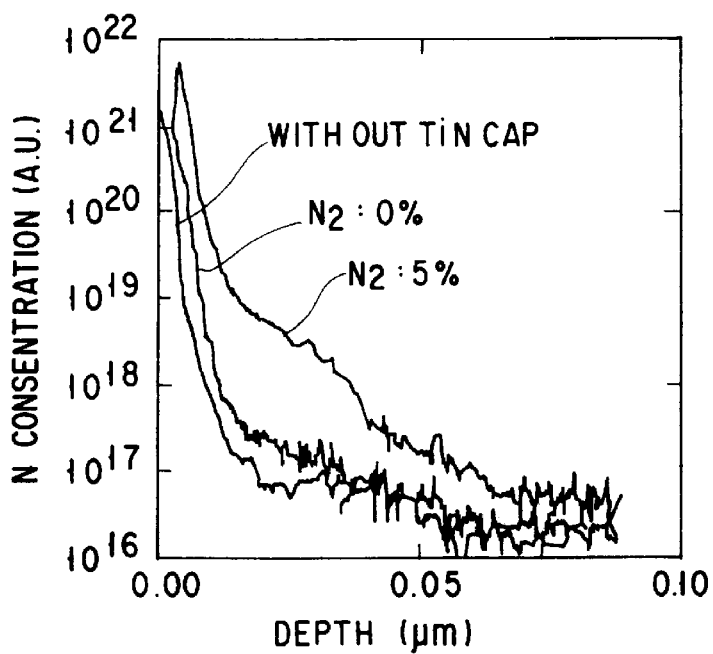
F I G. 5

F I G. 10
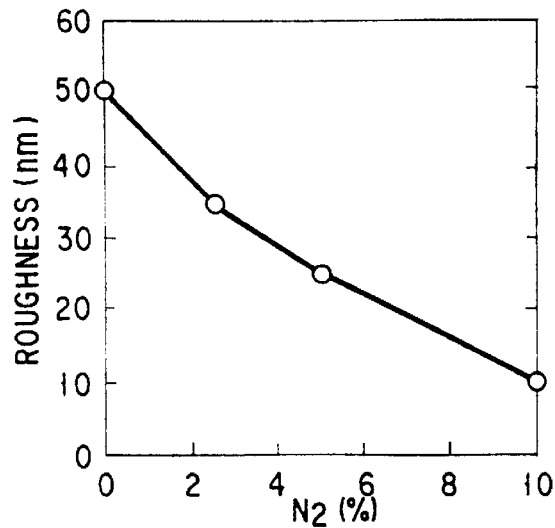
F I G. 11
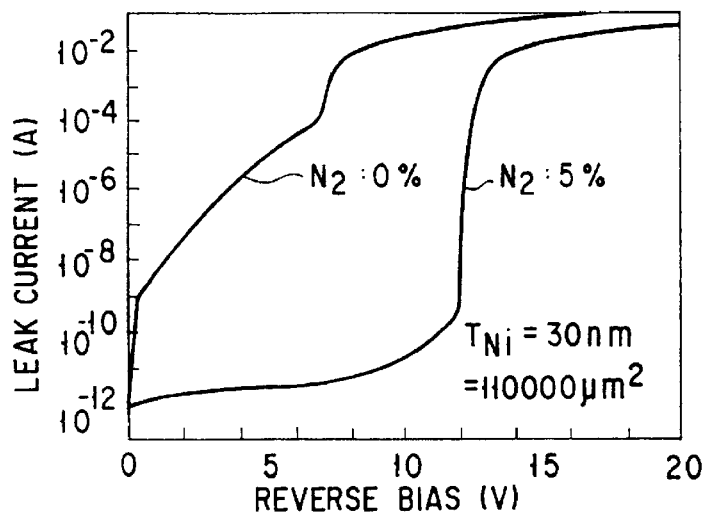
F I G. 13
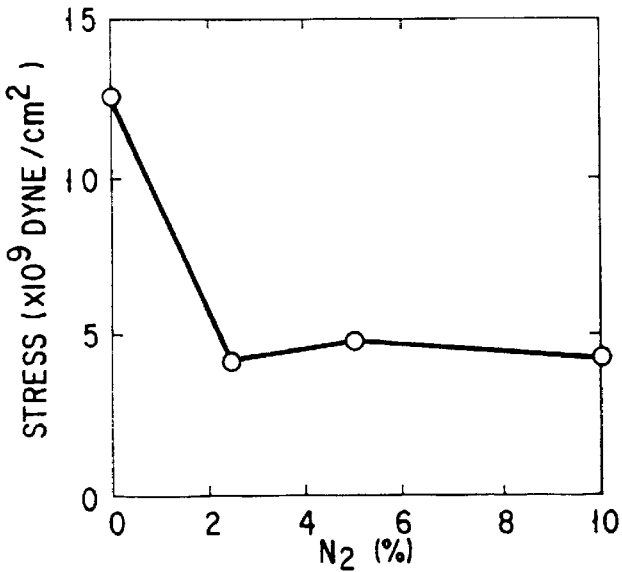

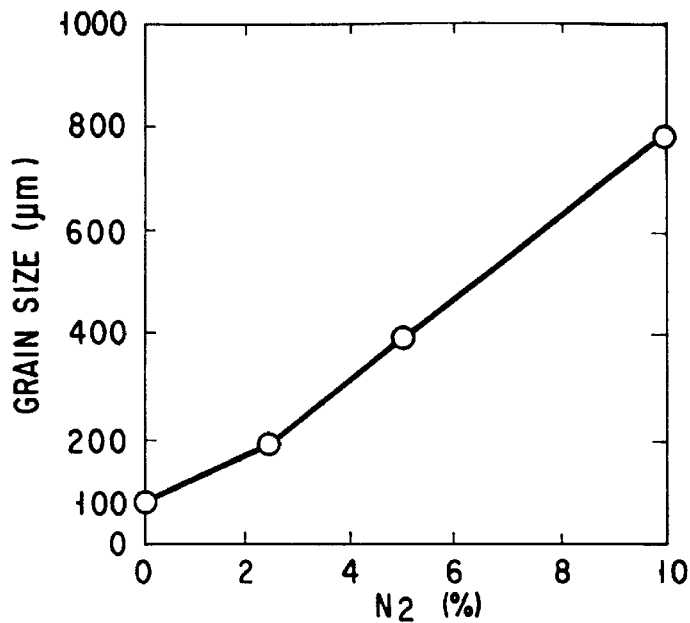
F I G. 15
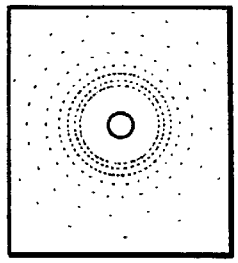
F I G. 16A
N₂ : 0%
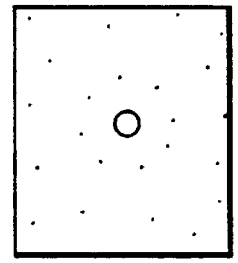
F I G. 16B
N₂ : 10%
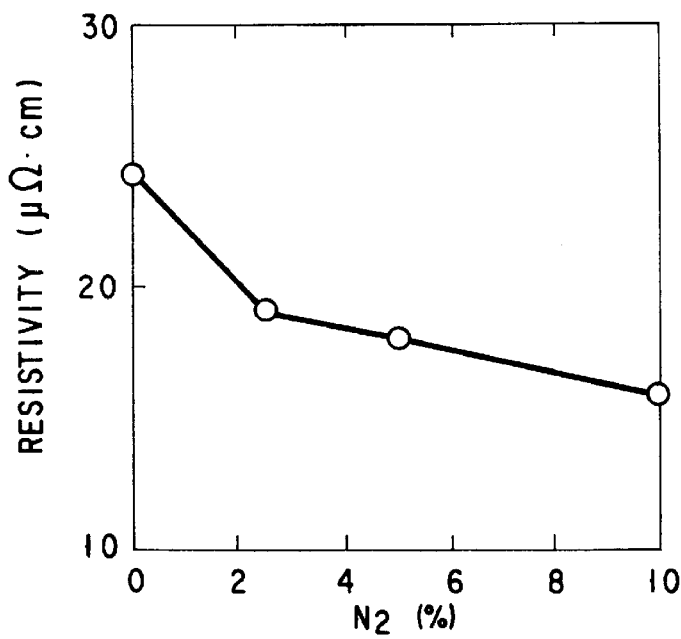
F I G. 17

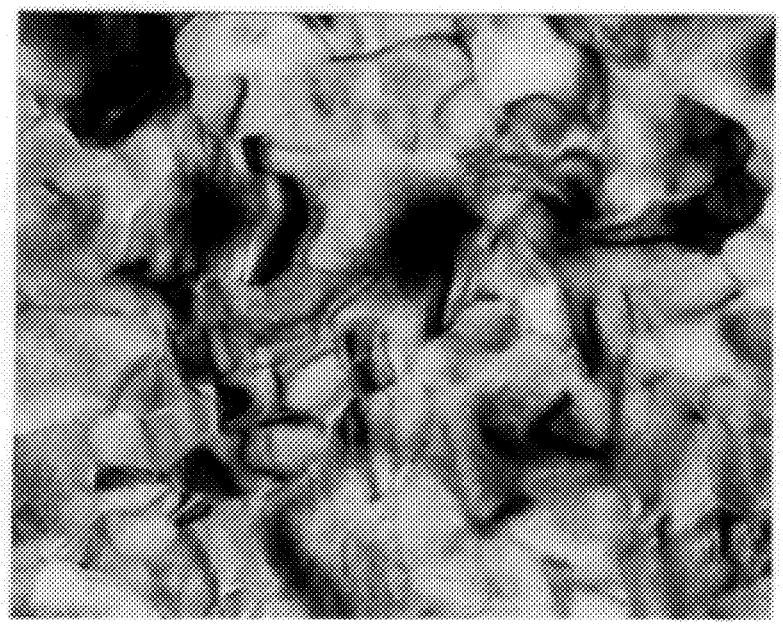
F I G. 23A  N2 : 0 %
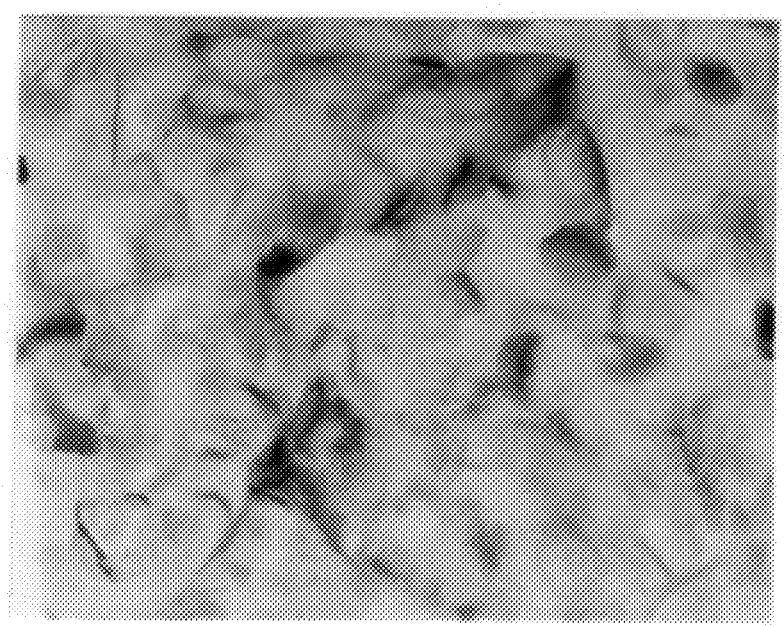
F I G. 23B  N2 : 5 %

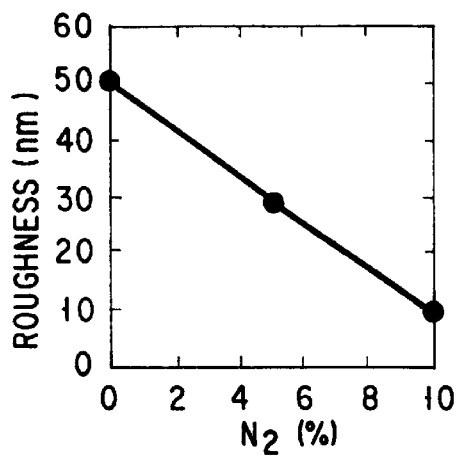
F I G. 25
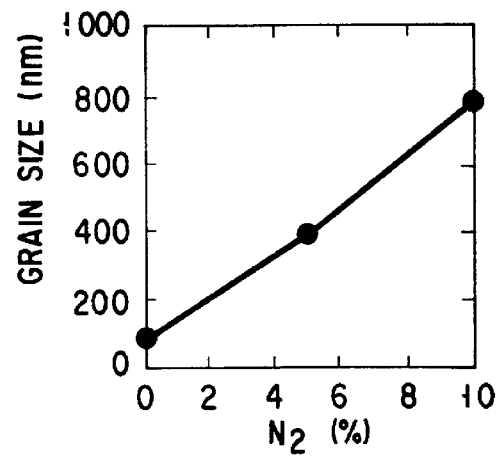
F I G. 27
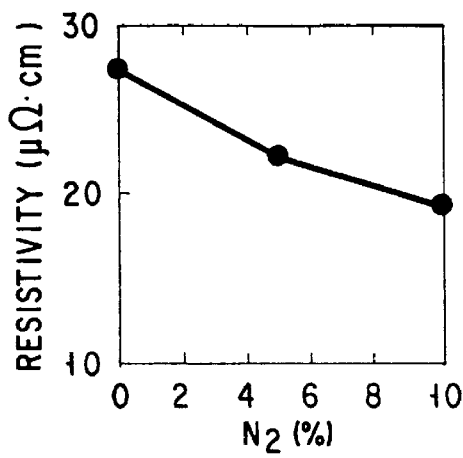
F I G. 28
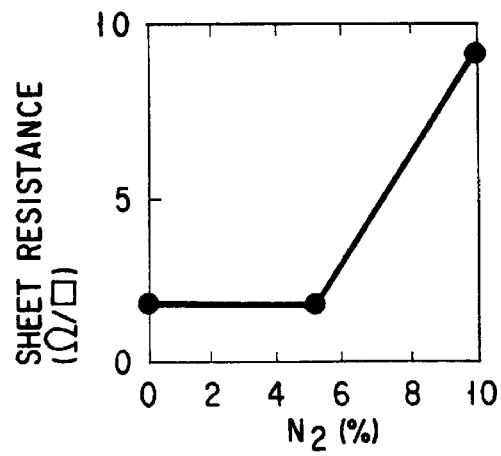
F I G. 29
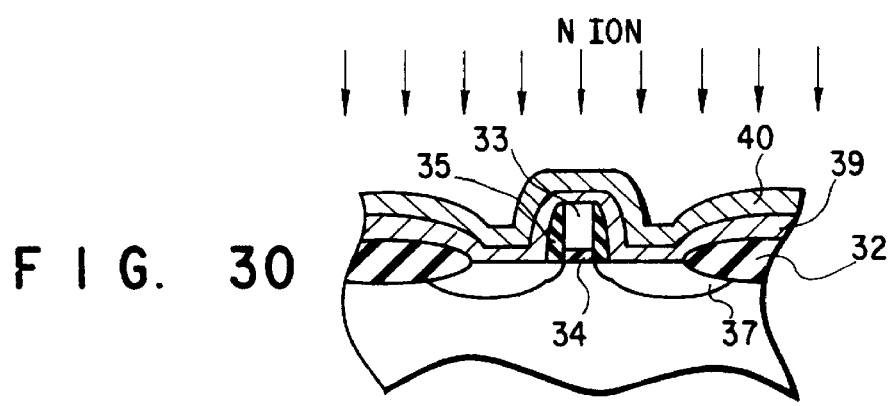
F I G. 30

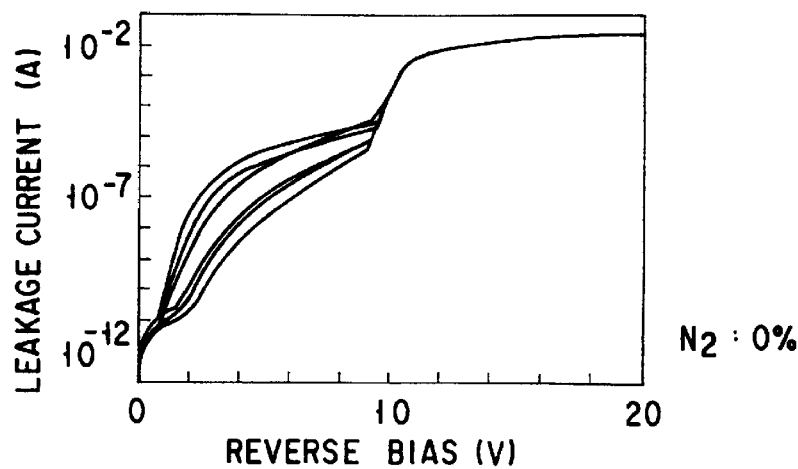
F I G. 26A    N₂ : 0%
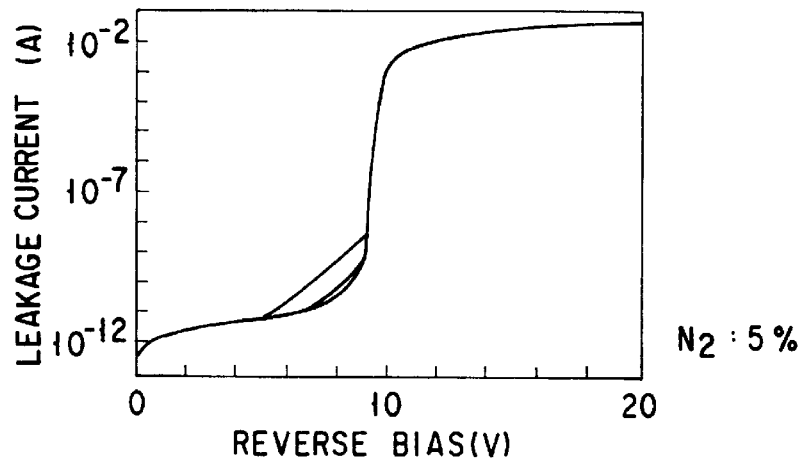
F I G. 26B    N₂ : 5%
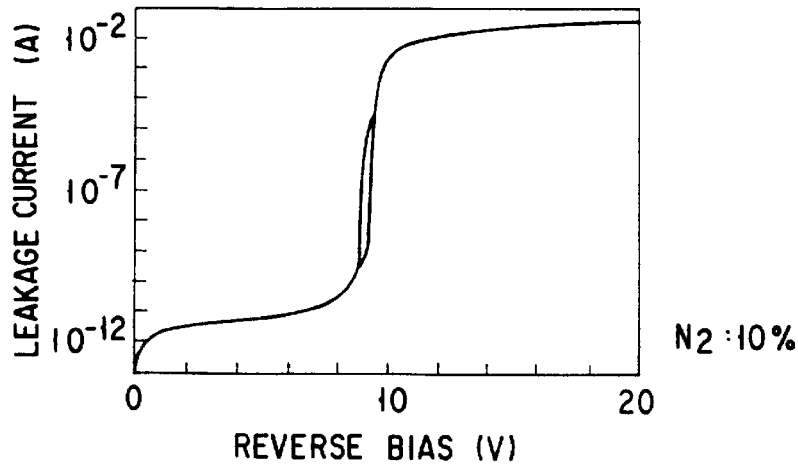
F I G. 26C    N₂ : 10%

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device, and, more particularly, to a semiconductor device using a metal silicide film such as a nickel silicide film or a cobalt silicide film.

2. Description of the Related Art

As the miniaturization of semiconductor devices, specially, MOSFETs (Metal Oxide Semiconductor Field Effect Transistors) progresses, the parasitic resistors formed by the source/drain diffusion layer and gate electrode interfere with the high-speed operation. As a solution to this problem, a method forming a metal silicide film as a low-resistance film on the surfaces of the source/drain diffusion layer has been proposed. FIG. 1 is a cross-sectional view of an MOSFET which is formed by this method. This MOSFET is fabricated as follows.

First, a gate electrode 3 of polysilicon or the like is formed via a gate insulating film 4 on an element region on the surface of a silicon substrate 1, which is surrounded by an element isolation region 2, and ion implantation is performed to form a diffusion layer having an LDD (Lightly Doped Drain) structure with the gate electrode 3 used as a mask. Subsequently, a side-wall insulating film 5 is formed on the side wall of the gate electrode 3.

With the gate electrode 3 and the side-wall insulating film 5 used as masks, ion implantation is carried out to form a source/drain diffusion layer 7 with a high impurity concentration after which the implanted ions are activated.

After an oxide film on the silicon substrate 1 is removed by dilute hydrofluoric acid treatment, a metal film like an Ni film is formed on the substrate 1 by sputtering and the resultant structure is subjected to a heat treatment to form a metal silicide film like an NiSi film 17.

Thereafter, the Ni film which has remained unreacted is removed and an unillustrated interlayer insulating film is deposited. Then, a contact hole is formed after which unillustrated interconnection is formed to complete an MOSFET.

It is known that the resistances of NiSi and $CoSi_2$ as metal suicides, unlike $TiSi_2$, do not increase even when the sizes of the source/drain diffusion layer 7 and the gate electrode 3 are reduced, and NiSi and $CoSi_2$ are suitable for use in a minute MOSFET (see, for example, T. Ohguro et al., "Analysis of Anormalously Large Junction Leakage Current of Nickel Silicided N-Type Diffused Layer and Its Improvement," SSDM 93, pp. 192–194). NiSi among silicide materials is very easily oxidized so that large undulations are formed at the interface region between the NiSi film 17 and the Si substrate 1 as shown in an enlarged view in FIG. 2, thus causing undesirable junction leak.

It is also known that oxidization causes large undulations to be formed at the interface region between the $CoSi_2$ film and the Si substrate, so that as the junction depth of the source/drain region becomes shallower, junction leak occurs.

To overcome this problem, the present inventor has proposed a method of continuously forming a TiN film as a cap film on the Ni film by sputtering and then subjecting the resultant structure to a heat treatment (Jpn. Pat. Appln. KOKAI Publication No. 7-38104). This method causes the nitriding of the surface of the NiSi film to prevent NiSi from being oxidized, thereby suppressing the formation of undulations.

Since the nitride film on NiSi which is formed by depositing TiN on Ni is thin, however, the barrier property may not be kept for a long period of time. There is therefore a demand for a semiconductor structure which can sufficiently prevent the oxidization of NiSi without providing a TiN film and can completely suppress the formation of undulations, and a method of manufacturing this semiconductor structure.

SUMMARY OF THE INVENTION

Accordingly, it is an object of the present invention to provide a semiconductor device having a flat boundary at a silicon substrate or the like and a method of manufacturing this semiconductor device.

To achieve this object, a method of manufacturing a semiconductor device according to the first aspect of this invention comprises the steps of:

forming a first metal film including a first metal on a surface of a silicon film by sputtering using a gas mixture added with a nitrogen gas, the first metal being one of nickel and cobalt; and causing thermal reaction of the silicon film with the first metal film to form a silicide film of the first metal.

It is preferable that the ratio of the nitrogen gas in the gas mixture falls in a range of 2.5% to 10%.

This method may further comprise a step of forming a second metal film containing a second metal on a surface of the first metal film after the step of forming the first metal film.

Preferably, the second metal is one selected from a group of Ti, W, $TiN_x$ and $WN_x$.

It is preferable that the step of forming the silicide film of the first metal be executed in an environment containing one of nitrogen and argon.

Another method of manufacturing a semiconductor device according to this invention may comprise the steps of:

forming a first metal film including a first metal on a surface of a silicon film, the first metal being one of nickel and cobalt;

adding nitrogen to the first metal film by ion implantation; and causing thermal reaction of the silicon film with the first metal film to form a silicide film of the first metal.

This method may further comprise a step of forming a second metal film containing a second metal on a surface of the first metal film after the step of forming the first metal film.

Preferably, the second metal is one selected from a group of Ti, W, $TiN_x$ and $WN_x$.

It is preferable that the step of forming the silicide film of the first metal be executed in an environment containing one of nitrogen and argon.

A method of manufacturing a semiconductor device according to the second aspect of this invention comprises the steps of:

forming a gate insulating film and a gate electrode comprised of silicon on a surface of a silicon film;

forming source/drain diffusion layers on both sides of the gate electrode on the surface of the silicon film;

forming a first metal film including a first metal on surfaces of the source/drain diffusion layers and the gate electrode by sputtering using a gas mixture added with a nitrogen gas, the first metal being one of nickel and cobalt;

causing thermal reaction of the silicon film and the silicon of the gate electrode with the first metal film to form silicide films of the first metal at interfaces where the source/drain diffusion layers and the gate electrode contact the first metal film; and removing non-reacted portions of the first metal film in the thermal reaction.

Preferably, the gas mixture contains argon and nitrogen.

It is preferable that the amount of a nitrogen content in the gas mixture falls in a range of 2.5% to 10%.

This method may further comprise a step of forming a second metal film including a second metal on the first metal film after the step of forming the first metal film; wherein the step of removing the non-reacted portions of the first metal film may include a step of removing the second metal film.

It is preferable that the second metal be one selected from a group of Ti, W, $TiN_x$ and $WN_x$.

Another method of manufacturing a semiconductor device may comprise the steps of:

forming a gate insulating film and a gate electrode comprised of silicon on a surface of a silicon film;

forming source/drain diffusion layers on both sides of the gate electrode on the surface of the silicon film;

forming a first metal film including a first metal on surfaces of the source/drain diffusion layers and the gate electrode, the first metal being one of nickel and cobalt;

adding nitrogen to the first metal film by ion implantation; and causing thermal reaction of the silicon film and the silicon of the gate electrode with the first metal film to form silicide films of the first metal at interfaces where the source/drain diffusion layers and the gate electrode contact the first metal film.

This method may further comprise a step of forming a second metal film containing a second metal on the first metal film after the step of forming the first metal film.

It is preferable that the second metal be one selected from a group of Ti, W, $TiN_x$ and $WN_x$.

A semiconductor device according to this invention comprises:

a silicon film;

an element forming region defined on the silicon film by an element isolation region formed on the silicon film;

a gate electrode of silicon insulatively formed on the silicon film on the element forming region;

source/drain regions formed on both sides of the gate electrode on the element forming region on the silicon film;

a first metal silicide film formed on the gate electrode;

gate side-wall insulating films formed continuously along side walls of the gate electrode and side walls of the first metal silicide film; and second metal silicide films formed on the source/drain diffusion layers each sandwiched between the element isolation region and one of the gate sidewall insulating films, whereby the first metal silicide film and the second metal silicide films are silicide films of one of nickel and cobalt and are formed on the source/drain diffusion layers by diffusion of the one of nickel and cobalt containing nitrogen into the silicon of the gate electrode and the silicon film by a heat treatment, and the first metal silicide film and the second metal silicide films at interfaces with the gate electrode and the source/drain diffusion layers have roughnesses of 40 nm or smaller.

It is preferable that the first metal silicide film and the second metal silicide films have grain sizes of 200 nm or greater.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3A through 3C are cross-sectional views illustrating a step-by-step method of forming a nickel silicide film according to the first embodiment of this invention;

FIG. 4 is a view used to explain the nickel silicide film according to the first embodiment of this invention and illustrating the results of the SIMS (Secondary-Ion Mass Spectrography) analysis of nitrogen after a nickel film and a titanium nitride film formed on a silicon substrate;

FIG. 5 is a view illustrating the results of the SIMS analysis of nitrogen in the nickel silicide film according to the first embodiment;

FIG. 10 is a diagram illustrating the relationship between the amount of a nitrogen content of the nickel silicide film according to the first embodiment and the roughness of the interface;

FIG. 11 is a diagram showing the PN junction leak characteristic of a diffusion layer including the nickel silicide film according to the first embodiment;

FIG. 13 is a diagram depicting the stress dependency of the amount of a nitrogen content of the nickel silicide film according to the first embodiment;

FIG. 15 is a diagram showing the $N_2$ amount dependency of the grain size of the nickel silicide film according to the first embodiment;

FIGS. 16A and 16B are diagrams showing the $N_2$ amount dependency of the electron beam analysis of the nickel silicide film according to the first embodiment;

FIG. 17 is a diagram showing the $N_2$ amount dependency of the resistivity of the nickel silicide film according to the first embodiment;

FIGS. 23A through 23C are plan TEM photographs of a cobalt silicide film according to the fourth embodiment showing the grain states in the cases where the amounts of $N_2$ added during the film formation process are 0%, 5% and 10%;

FIG. 25 is a graph illustrating the relationship between the amount of nitrogen added in the cobalt silicide film according to the fourth embodiment of this invention and the roughness of the interface between a silicide film and a source/drain layer;

FIGS. 26A through 26C are graphs showing the leakage current characteristics when the reverse bias is applied to the PN junction of the source/drain layer of an MOSFET which uses the cobalt silicide film according to the fourth embodiment in the cases where the amounts of $N_2$ added during the process of forming a silicide film are 0%, 5% and 10%;

FIG. 27 is a graph showing the relationship between the amount of nitrogen added in the cobalt silicide film according to the fourth embodiment of this invention and the grain size;

FIG. 28 is a graph showing the relationship between the amount of nitrogen added in the cobalt silicide film according to the fourth embodiment of this invention and the resistivity;

FIG. 29 is a graph showing the relationship between the amount of nitrogen added in the cobalt silicide film according to the fourth embodiment of this invention and the sheet resistance; and FIG. 30 is an exemplary diagram for explaining an N ion implantation step for an MOSFET according to the sixth embodiment of this invention.

DETAILED DESCRIPTION OF THE PREFERRED EMBODIMENTS

Preferred embodiments of the present invention will now be described referring to the accompanying drawings.

First Embodiment

Figure 1:
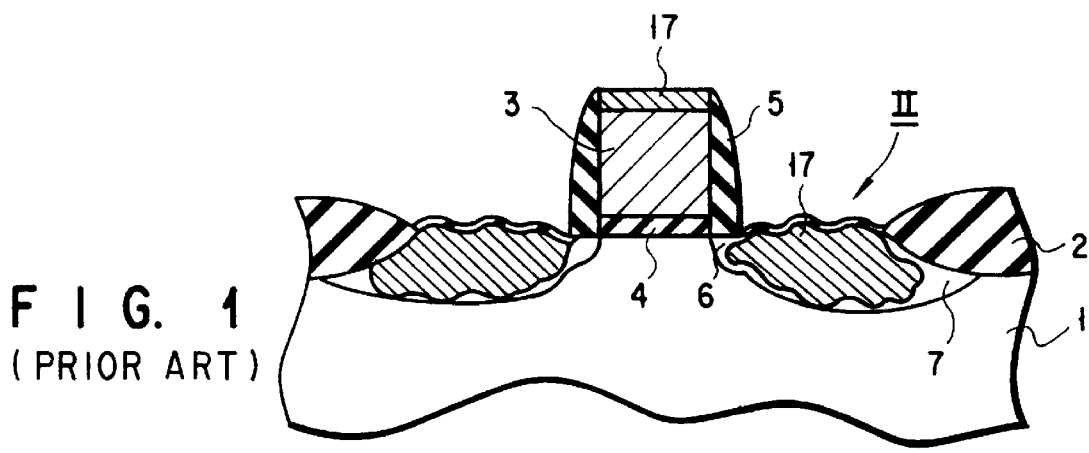
FIG. 1 is a cross-sectional view of an MOSFET for explaining the problems of a conventional MOSFET which uses an NiSi film.
Figure 2:
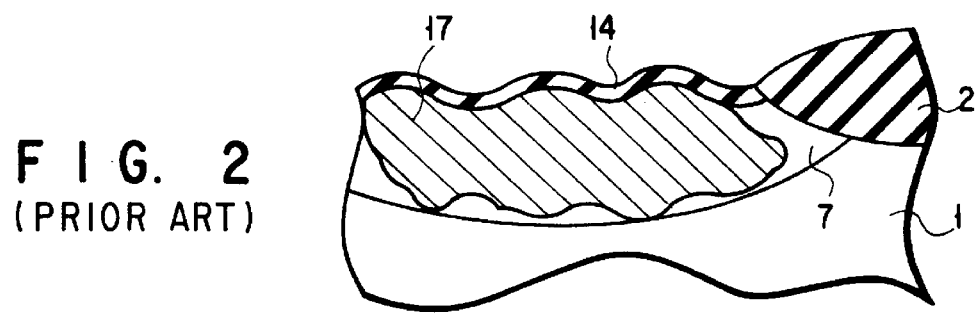
FIG. 2 is an enlarged cross-sectional view of a source/drain electrode in FIG. 1.
Figure 3A:
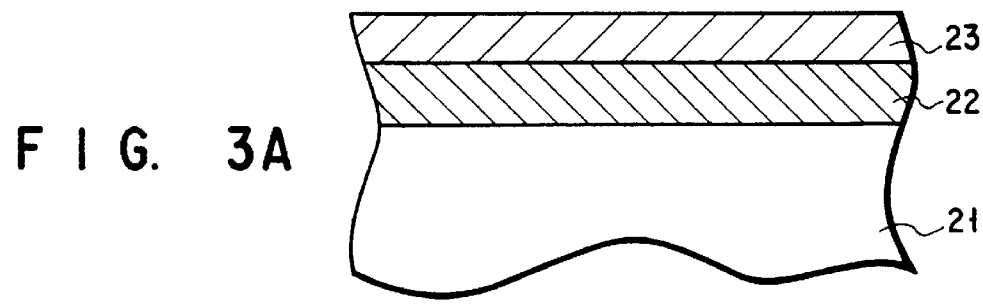
Figure 3B:
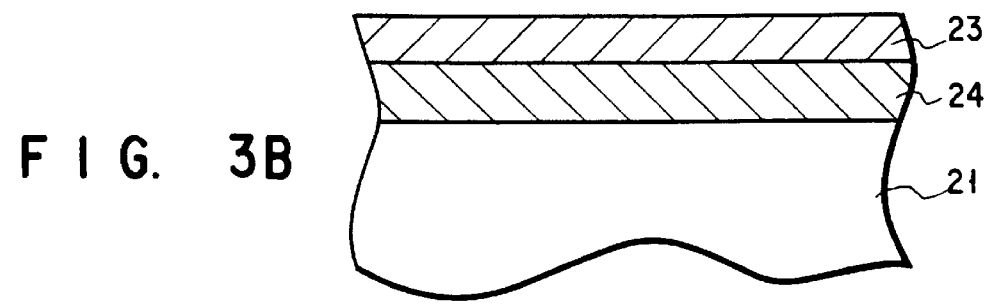

FIGS. 3A through 3C are cross-sectional views illustrating a method of fabricating a nickel silicide film according to the first embodiment of this invention. FIG. 3C shows a completed structure in which a metal silicide film 24 of NiSi is formed on an Si substrate 21. This metal silicide film 24 is formed as follows.

First, a metal film 22 of Ni is deposited on the Si substrate 21 by sputtering as shown in FIG. 3A. At this time, 2.5 to 10% of $N_2$ is mixed in the Ar gas which is used for the sputtering. Subsequently, a nitrogen-containing metal film 23, for example, a TiN film, is deposited on the metal film 22 by sputtering without exposing this substrate to air.

Then, the substrate is subjected to a heat treatment for 30 sec at a temperature of 400° to 700° C. in the environment of, for example, Ar or $N_2$, so that the surface of the Si substrate 21 which contacts the metal film 22 is transformed to a metal silicide film 24 by the diffusion of metal (Ni), as shown in FIG. 3B.

Further, the TiN film 23 is wet-etched by a solution mixture of sulfuric acid and hydrogen peroxide, yielding a metal silicide (NiSi) film 24 shown in FIG. 3C.

The results of the evaluation of the thus acquired NiSi film or an NiSi film under formation will be described below.

FIG. 4 illustrates the results of the SIMS (Secondary-Ion Mass Spectrography) analysis of a TiN film, Ni film and N in an Si substrate after Ni and TiN are successively deposited on the Si substrate. Since N in Ni cannot be measured directly, it is measured in the form of Ni-N.

FIG. 4 shows the cases where the ratios of the $N_2$ gas in the sputtering gas at the time of depositing an Ni film are 0%, 5% and 10%. The curve for the 0% $N_2$ gas shows the intensity of Ni-N in the Ni film and TiN film deposited by sputtering without adding any $N_2$ gas. This curve shows a strong intensity of Ni-N in the Ni film in the vicinity of the interface between Ni and TiN even with 0% of $N_2$, and such seems to have occurred due to the diffusion of N in TiN into the Ni surface.

It is understood that N is present on and deep inside the surface of the Ni film which has been formed by the addition of 5% or 10% of an $N_2$ gas in the sputtering gas that has been used at the time of forming the Ni film by sputtering. The above results show that N can be mixed into the Ni film by adding the $N_2$ gas in the sputtering gas at the time of forming the Ni film.

FIG. 5 shows the results of the SIMS analysis of N in NiSi after the deposited Ni film and the Si substrate are reacted with each other by a heat treatment and non-reacted Ni and TiN are removed by a mixed solution of hydrogen peroxide and sulfuric acid. In this case, the results of the analysis of N are acquired by compensating the Si-N signal with the Si signal. With regard to NiSi ($N_2$: 0%) with no nitrogen added to Ni, only the surface is nitrided. With regard to the NiSi film comprised by the Ni film formed by adding 5% of $N_2$, the surface as well as the inside the film are nitrided.

Figure 6:
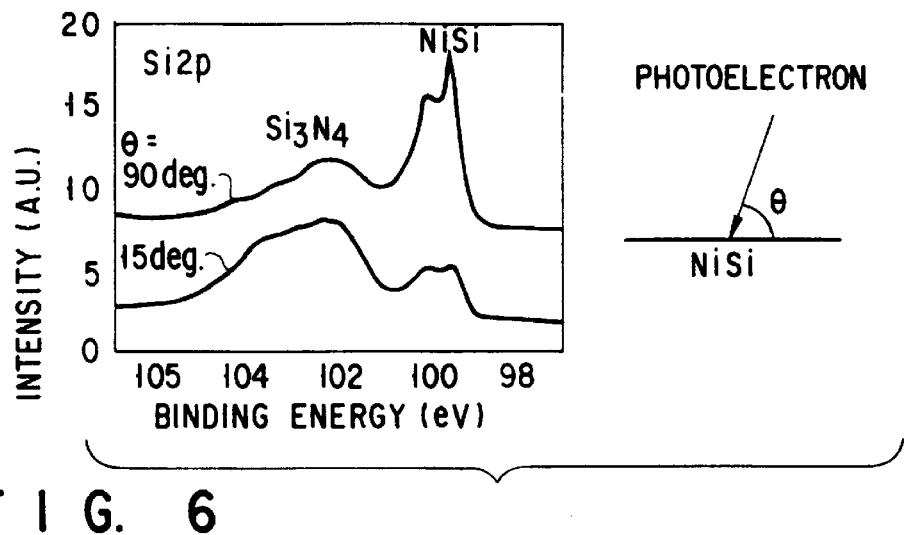
FIG. 6 is a view showing the results of the XPS (X-ray Photo-electron Spectrography) analysis of the nickel silicide film according to the first embodiment.

When the XPS (X-ray Photo-electron Spectrography) analysis of the NiSi film obtained from the Ni film formed with the addition of 5% of an $N_2$ gas was performed, an Si nitride ($Si_3N_4$) was detected as shown in FIG. 6. When the incident angle of photoelectrons is small, $Si_3N_4$ is seen prominently. It is considered that this nitride film is formed on the surface and serves as an oxidization resistant film to protect the NiSi film against the oxidization.

FIGS. 7A through 7D illustrate sketches of cross-sectional TEM (Transmission Electron Microscope) photographs of the nickel silicide films with different amounts of nitrogen. An amorphous layer is seen on the surface of the NiSi film in FIG. 7A ($N_2$: 0%) with no nitrogen added. It is understood from the EDX (Energy Dispersive X-ray Spectrography) analysis of a portion 8A of this amorphous layer that a relatively strong oxygen signal is detected as shown in FIG. 8A, indicating that the surface of the NiSi film is oxidized. With regard to a portion 8B inside the NiSi film, an oxygen signal is relatively weak, as shown in FIG. 8B.

Figure 7A:
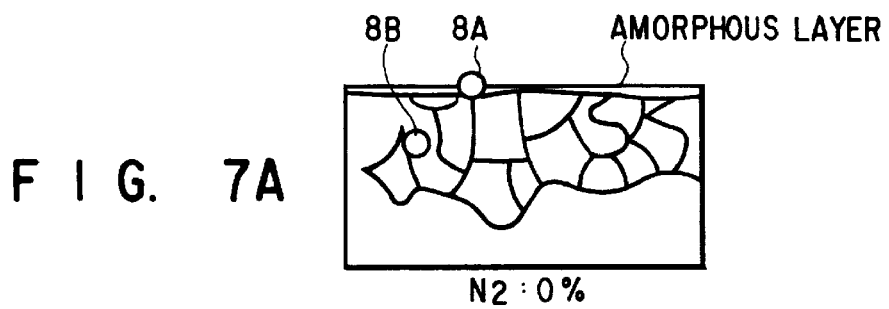
FIGS. 7A through 7D are schematic diagrams of the cross-sectional TEM (Transmission Electron Microscope) of the nickel silicide film according to the first embodiment.
Figure 7B:
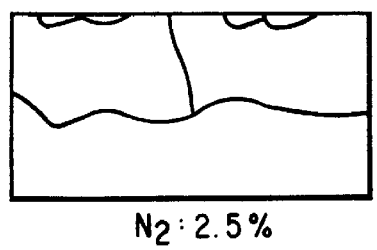
Figure 7C:
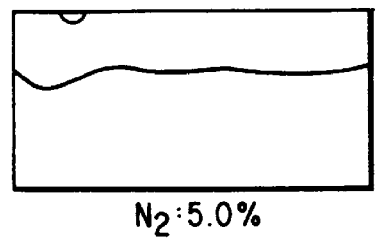
Figure 7D:
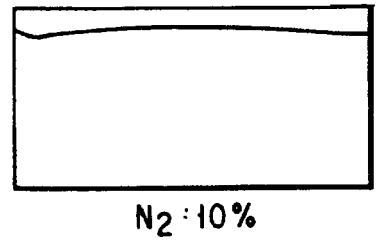
Figure 8A:
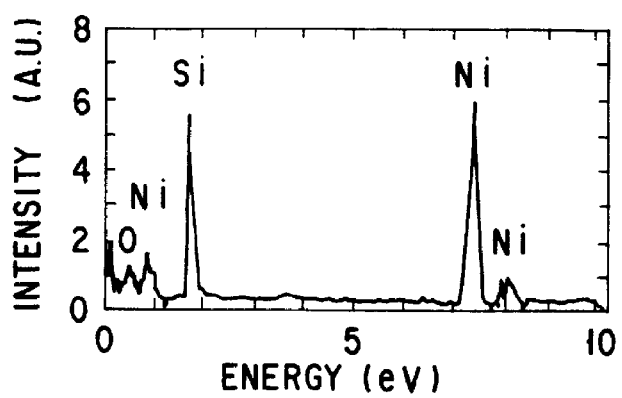
FIGS. 8A and 8B are diagrams showing the results of the EDX (Energy Dispersive X-ray Spectrography) analysis of the nickel silicide film according to the first embodiment and the results of EDX of portions 8A and 8B in FIG. 7A, respectively.
Figure 8B:
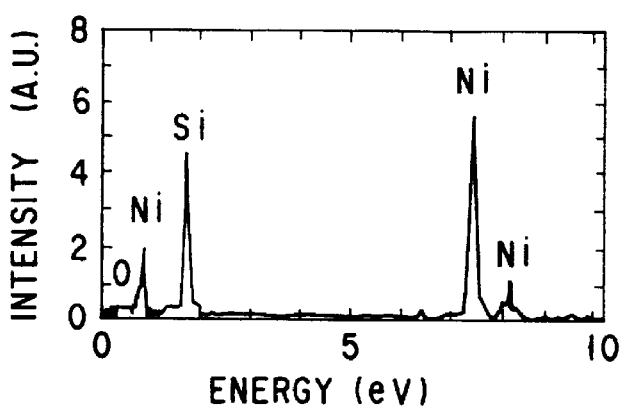

While an amorphous layer is formed on the NiSi film which is formed by using an Ni film added with 2.5% of $N_2$ (FIG. 7B), it is less (though not shown in FIG. 7B) than the amorphous layer in FIG. 7A. Such an amorphous layer is not seen on the NiSi film (FIG. 7C) which is formed by using an Ni film added with 5% or more of $N_2$, indicating that oxidization is suppressed. The elimination of the oxide film reduces the contact resistance with an electrode material, like Al, formed on NiSi. With regard to the film formed by adding 10% of $N_2$ (see FIG. 7D), those effects become more prominent.

Figure 9:
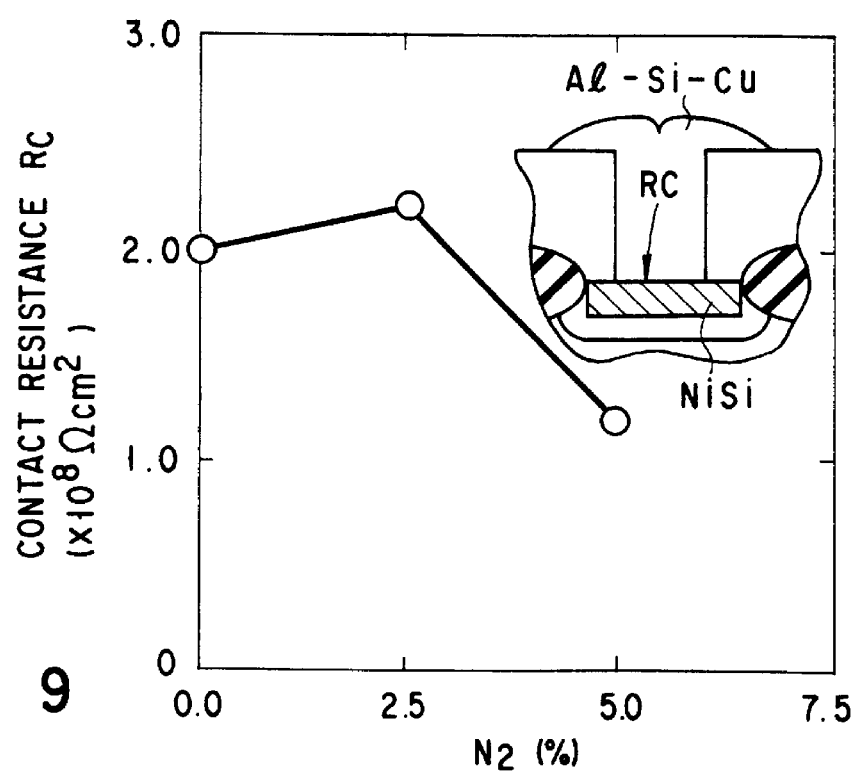
FIG. 9 is a diagram illustrating the relationship between the amount of a nitrogen content of the nickel silicide film according to the first embodiment and the contact resistance.

FIG. 9 illustrates the nitrogen content dependency of the contact resistance. It is apparent that the contact resistance of the NiSi film acquired by the Ni film which is formed with 5% of an $N_2$ gas added has been improved to become approximately half the contact resistance of the NiSi film acquired by the Ni film which is formed with no $N_2$ gas added.

FIG. 10 presents a graph illustrating the relationship between the amount of a nitrogen content and the size of the undulation at the interface between the NiSi film and the Si substrate which is estimated from a cross-sectional TEM photograph. The size of the undulation rapidly decreases with an increase in the amount of nitrogen. As a small undulation increases the distance from the NiSi film to the junction between the silicon substrate and the source/drain diffusion layer, junction leak can be suppressed.

Figure 12:
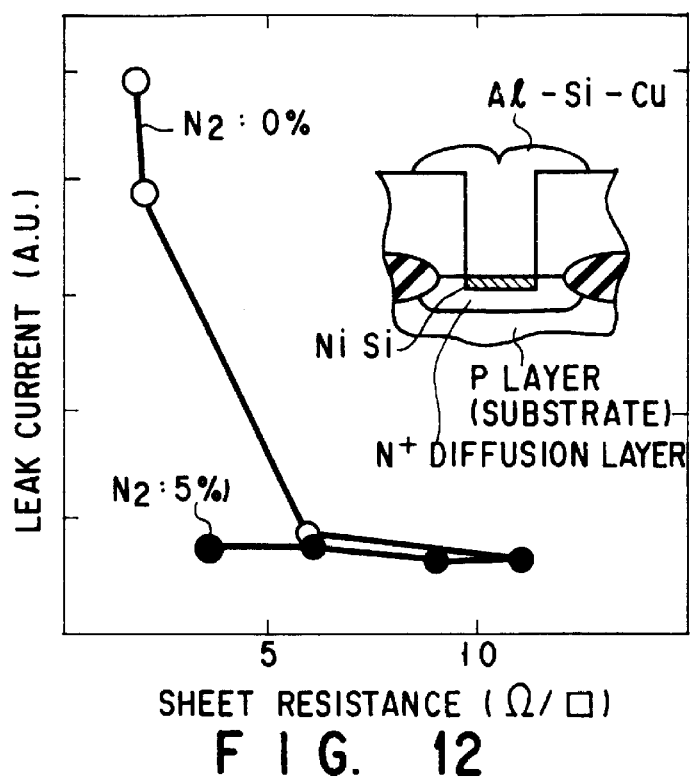
FIG. 12 is a diagram showing the sheet resistance dependency of the PN junction leakage current of the diffusion layer including the nickel silicide film according to the first embodiment.
Figure 14A:
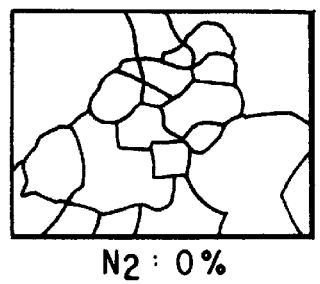
FIGS. 14A through 14D are schematic diagrams of the plane TEM of the nickel silicide film according to the first embodiment in the cases where the amounts of an $N_2$ content are 0%, 2.5%, 5% and 10%.
Figure 14B:
Figure 14C:
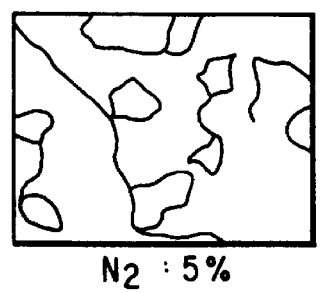
Figure 14D:
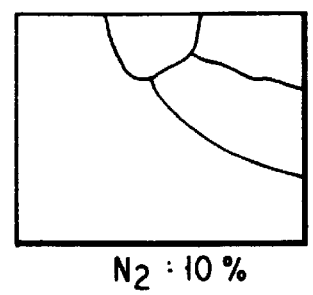

FIGS. 11 and 12 show the actual results of comparison between the junction leak for the NiSi film acquired from the Ni film which is formed by adding 5% of an $N_2$ gas (curves with $N_2$: 5% in the diagrams) and the junction leak for the NiSi film acquired from the Ni film which is formed by adding no $N_2$ gas (curves with $N_2$: 0% in the diagrams).

FIG. 11 shows the junction leak when a PN junction reverse bias is applied in the case the NiSi film is formed by thermal annealing. While the NiSi film with 0% of $N_2$ shows degradation in the junction characteristic, the NiSi film with 5% of $N_2$ shows no such degradation at all. The "PN junction reverse bias" means the application of the reverse bias to the PN junction formed by an N$^+$ diffusion layer and a P layer (substrate) in the cross-sectional view of the contact portion illustrated in FIG. 12 which will be discussed below.

In FIG. 12, the abscissa represents the sheet resistance and the ordinate represents the leakage current when the reverse bias is applied. It is apparent from this diagram that no leak is seen for the NiSi film acquired from the Ni film which is formed by adding 5% of an $N_2$ gas even when the sheet resistance is dropped to 3 $\Omega/\square$. In this case, the NiSi film is formed only at the lower portion of the contact hole after the contact hole is formed.

FIG. 13 shows the relationship between the film stress of the NiSi film and the amount of an $N_2$ gas added at the time of forming the Ni film. It is apparent from this diagram that the NiSi film acquired from the Ni film which is formed by adding an $N_2$ gas also reduces the film stress. When the film stress is small, the silicide film is not easily separated and the stress-originated junction leak is improved.

It is understood from the sketches of the plan TEM photographs in FIGS. 14A through 14D that as the amount of the $N_2$ gas added at the time of forming the Ni film increases, the grain size of the NiSi film becomes greater.

FIG. 15 shows the dependency of the grain size on the amount of the $N_2$ gas to be added at the time of forming the $N_2$ film. The grain size of the NiSi film acquired from the Ni film which is formed by adding 10% of nitrogen is increased to approximately eight times the grain size of the NiSi film acquired from the Ni film which is formed without adding nitrogen at all. This is because the single crystallization of the NiSi film progresses with an increase in the amount of nitrogen. The electron beam analysis shows that the NiSi film (FIG. 16B) acquired from the Ni film which is formed by adding 10% of the $N_2$ gas varies less than the NiSi film (FIG. 16A) acquired from the Ni film which is formed without adding the $N_2$ gas at all with respect to the number of spots and the distances to the spots. This small variation reflects the high orientation of crystal thereof.

This difference in variation also appear on the resistivity. FIG. 17 shows the relationship between the resistivity of the NiSi film and the amount of nitrogen added at the time of forming the Ni film. It is understood from this diagram that the resistivity decreases as the amount of nitrogen increases. It is however confirmed that the sheet resistance rapidly increases when the ratio of the added nitrogen exceeds 10%.

Second Embodiment

A description will now be given of the case where the above-discussed NiSi film is adapted for use in an MOSFET.

FIGS. 18A through 18F are cross-sectional views of an MOSFET illustrating a step-by-step method of fabricating an MOSFET according to the second embodiment of this invention.

Figure 18A:
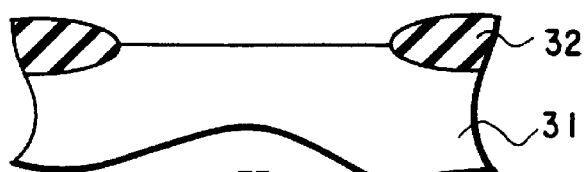
FIGS. 18A through 18F are cross-sectional views of an MOSFET illustrating a step-by-step method of fabricating an MOSFET according to the second embodiment of this invention.
Figure 18B:
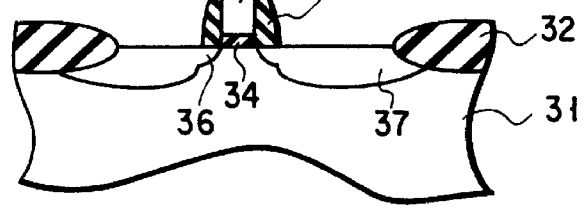

First, an element isolation region 32 surrounding an element forming region on the surface of a silicon substrate 31 is formed by LOCOS or the like, as shown in FIG. 18A. Thereafter, ion implantation in a channel region is performed, and then a gate oxide film 34 is formed by thermal oxidation after which polysilicon to be a gate electrode 33 is deposited as shown in FIG. 18B.

After the polysilicon is patterned to form the gate electrode 33, ions having the opposite conductivity to that of the substrate 31 are implanted into the substrate 31 with the gate electrode 33 as a mask to form a source/drain diffusion layer 36 which has an LDD structure. Then, an insulating film, for example, an $Si_3N_4$ film, is deposited on the entire substrate surface by LPCVD (Low Pressure Chemical Vapor Deposition) or the like, and then anisotropic etching such as RIE (Reactive Ion Etching) is carried out to form a gate side-wall insulating film 35.

Thereafter, ions for forming a highly doped source/drain diffusion layer 37 are implanted into the substrate 31. The implanted impurity is activated by thermal annealing, for example, RTA (Rapid Thermal Annealing), for 20 sec at 1000° C., thus forming the highly doped source/drain diffusion layer 37.

Figure 18C:
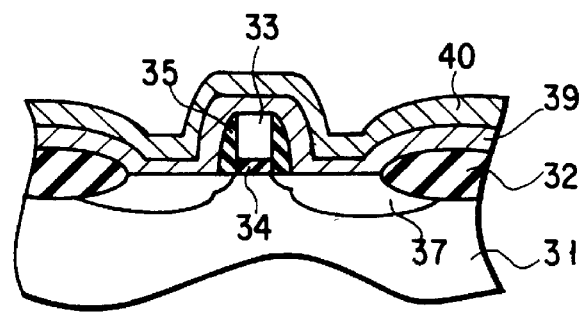

After an oxide film (not shown) on the source/drain diffusion layer 37 and the gate electrode 33 is removed by a dilute hydrofluoric acid treatment, a metal film 39 of Ni is formed by using a sputtering device as shown in FIG. 18C. At this time, N is added in the Ni deposition film by mixing 2.5 to 10% of the $N_2$ gas into the Ar gas in the sputtering device. Subsequently, a nitrogen-containing metal film, e.g., a TiN film 40 is deposited on the metal film 39 by sputtering without exposing this substrate to air.

Figure 18D:
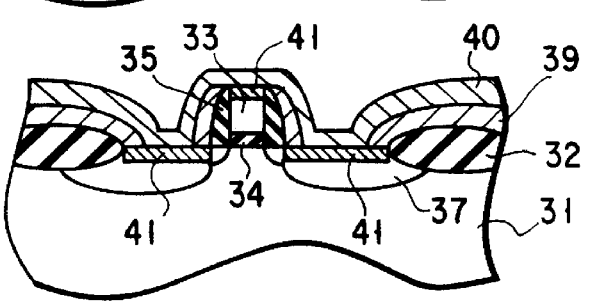

The resultant structure is subjected to thermal annealing under the Ar or $N_2$ environment for 30 sec at 400° to 700° C., for example, so that the Si surfaces of the source/drain diffusion layer 37 and the gate electrode 33 are transformed to a metal silicide (NiSi) film 41 as shown in FIG. 18D. At this time, Ni on the element isolation region 32 and the gate side-wall insulating film 35 remains non-reacted.

Figure 18E:
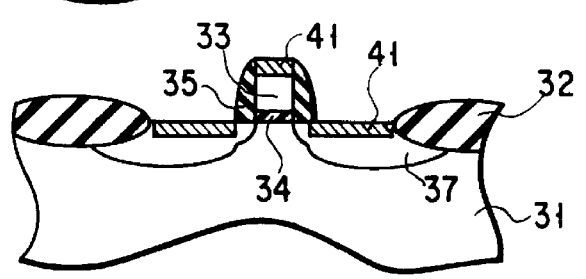

Then, the non-reacted metal film 39 and TiN film 40 are selectively removed in a wet treatment using a mixed solution of sulfuric acid and hydrogen peroxide, as shown in FIG. 18E. This process allows the metal silicide (NiSi) film 41 to selectively remain on the surfaces of the source/drain diffusion layer 37 and the gate electrode 33.

Figure 18F:
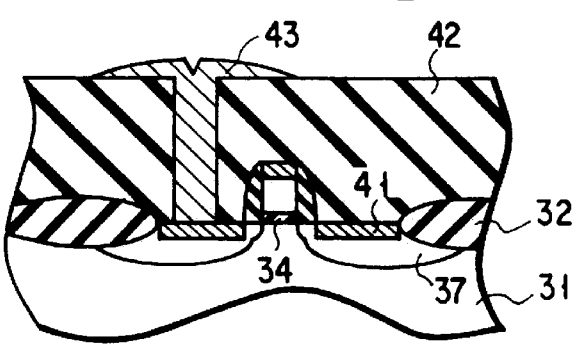

Then, an insulating film 42 is formed to 900 nm thick by, for example, normal pressure CVD and a contact hole is formed in the insulating film 42, as shown in FIG. 18F. Subsequently, an electrode material, such as Al—Si—Cu, is deposited on the resultant structure by sputtering and is patterned to form an interconnection 43. When a double-layered interconnection or a triple-layered interconnection is required thereafter, another insulating film should be deposited, a via contact hole should be formed therein and an electrode material should be deposited and patterned.

Although the oxide film on the source/drain regions 36 and 37 and the gate electrode is removed by a dilute hydrofluoric acid treatment prior to the deposition of the Ni film in this embodiment, the oxide film may be removed by reverse sputtering using an inactive gas like an Ar gas.

Although nitrogen-containing metal is deposited on Ni, this metal should not necessarily be deposited thereon.

Third Embodiment

Figure 19:
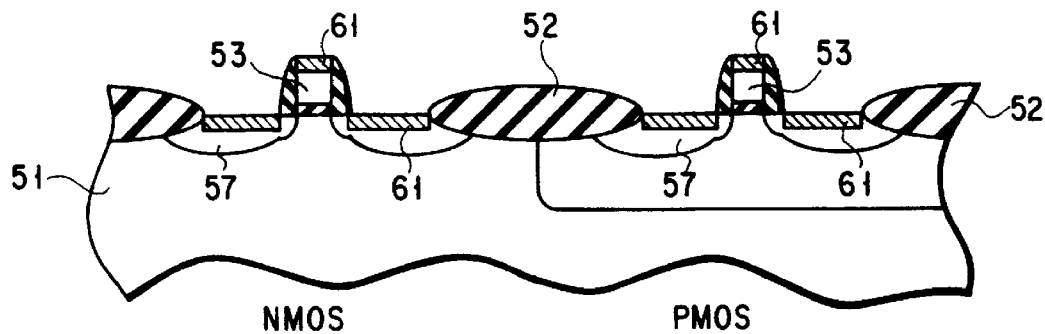
FIG. 19 is a cross-sectional view of a CMOSFET according to the third embodiment of this invention.
Figure 20:
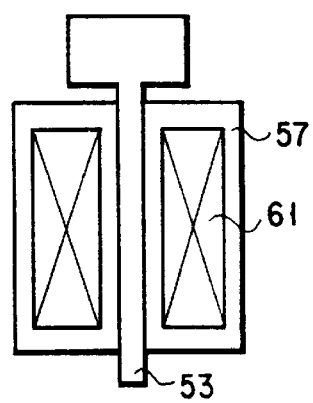
FIG. 20 is a plan view of a single transistor portion of the CMOSFET according to the third embodiment of this invention.

A description will now be given of the case where the above-discussed NiSi film is adapted for use in a CMOSFET. FIG. 19 is a cross-sectional view of a CMOSFET according to the third embodiment, and FIG. 20 is a plan view of a single transistor portion at which an NiSi film 61 fully contacts a source/drain region 57.

Because the scheme of forming the NiSi film 61 is the same as that in the second embodiment and a well-known method can be used to fabricate a CMOSFET, their descriptions will be omitted.

Figure 21A:
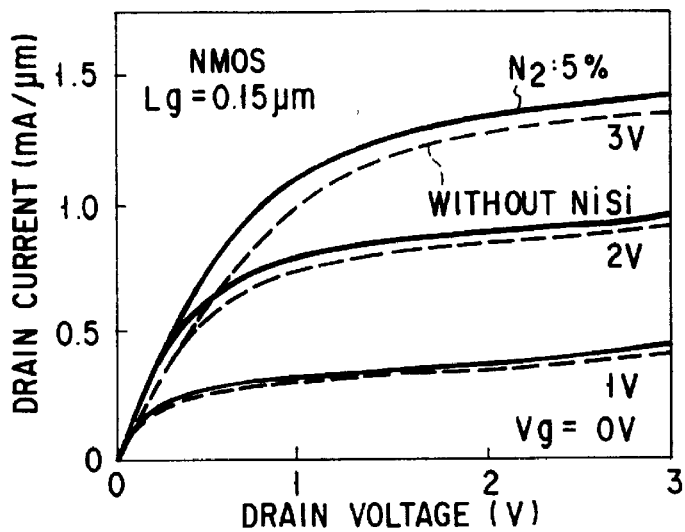
FIGS. 21A and 21B are diagrams illustrating the drain voltage dependencies of the drain current of the CMOSFET according to the third embodiment of this invention and respectively illustrating those of an NMOS and a PMOS.
Figure 21B:
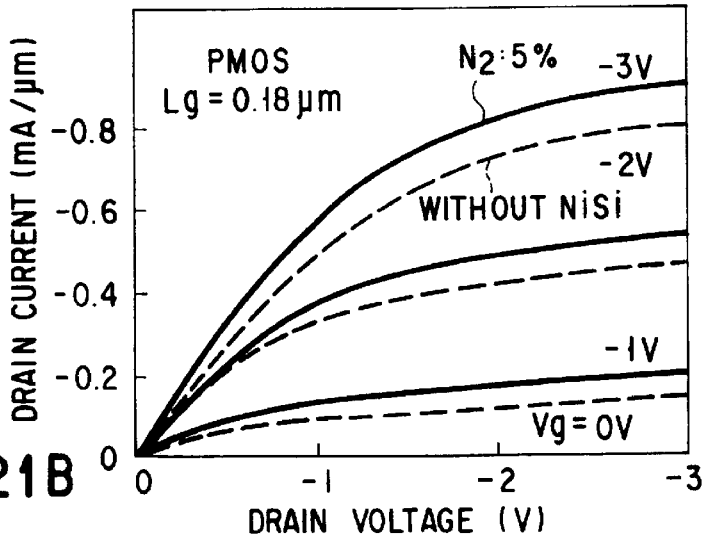

FIGS. 21A and 21B show the results of comparison between the characteristic of the CMOSFET whose NiSi film is formed by adding an $N_2$ gas and the characteristic of the CMOSFET whose NiSi film is formed by adding no $N_2$ gas respectively for an NMOS (gate length of 0.15 μm) and a PMOS (gate length of 0.18 μm) of the CMOSFET.

It is understood that the driving power of the MOSFET whose NiSi film is formed on the gate electrode and the source/drain diffusion layer has been improved due to the reduction in the sheet resistance of the surface of the source/drain diffusion layer.

Figure 22A:
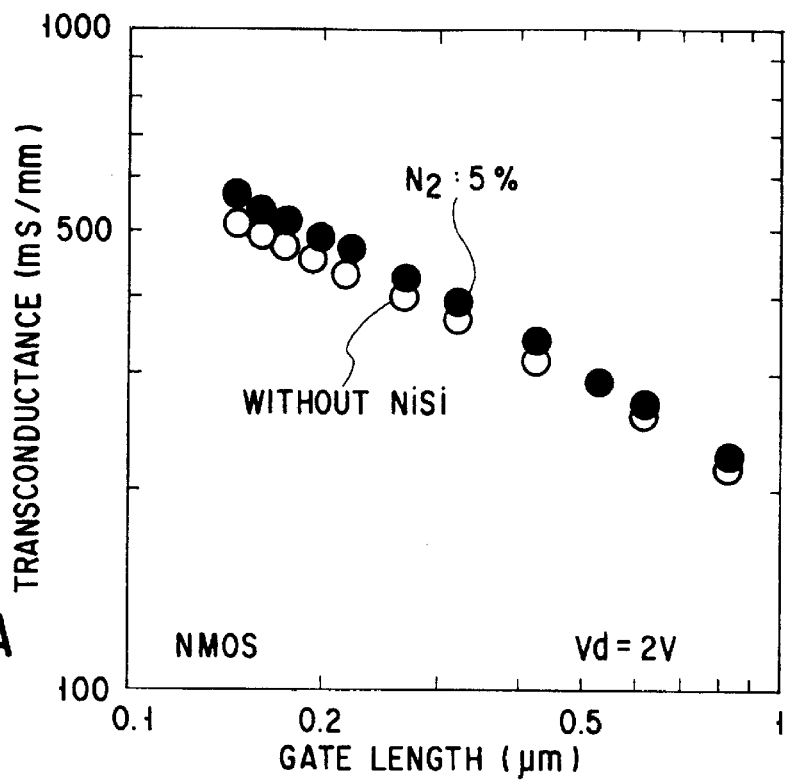
FIGS. 22A and 22B are diagrams illustrating the gate length dependencies of the transconductances of the CMOSFET according to the third embodiment of this invention and respectively illustrating those of an NMOS and a PMOS.
Figure 22B:
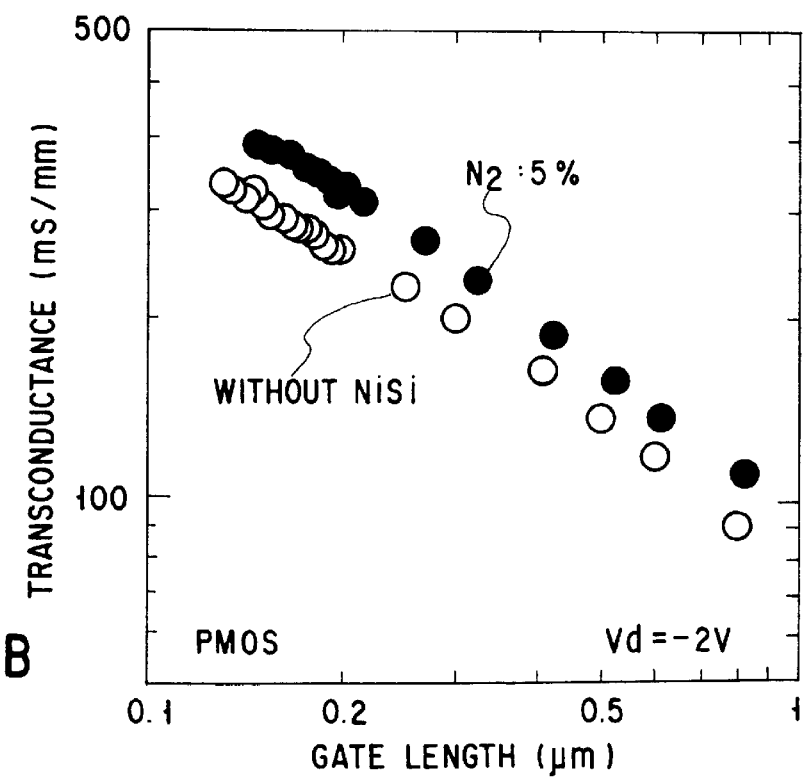

FIGS. 22A and 22B illustrate the relationship between transconductance and the gate length. With respect to the aforementioned gate lengths, the transconductances of the NMOS and PMOS having no NiSi films are 520 mS/mm and 350 mS/mm respectively whereas the transconductances of the NMOS and PMOS having NiSi films formed by adding the $N_2$ gas are improved to be 590 mS/mm and 410 mS/mm respectively.

Although the foregoing description of the first to third embodiments has been given with reference to NiSi, the same advantages can be obtained if $CoSi_2$ is used. An embodiment which uses $CoSi_2$ will now be discussed.

Fourth Embodiment

As the fourth embodiment relates to a method of forming a cobalt silicide film, which fundamentally involves the same steps as the first embodiment, this embodiment will be described referring to FIGS. 3A through 3C. FIG. 3C shows a completed structure and a metal silicide film 24 of $CoSi_2$ on an Si substrate 21. This metal silicide film 24 is formed as follows.

First, a metal film 22 of Co is deposited on the Si substrate 21 by sputtering as shown in FIG. 3A. At this time, 2.5 to 10% of $N_2$ is mixed in the Ar gas. Subsequently, a nitrogen-containing metal film 23, for example, a TiN film, is deposited on the metal film 22 by sputtering without exposing this substrate to air.

Then, the substrate is subjected to a heat treatment for 30 sec at a temperature of 500° C. in the environment of Ar or $N_2$, for example, so that the surface of the Si substrate 21 which contacts the metal film 22 is transformed to a metal silicide ($CoSi_2$) film 24, as shown in FIG. 3B.

Further, a non-reacted metal film 22' and the TiN film 23 are wet-etched by a mixed solution of sulfuric acid and hydrogen peroxide, yielding a metal silicide ($CoSi_2$) film 24 shown in FIG. 3C. Since the resistance of the $CoSi_2$ film is high at this time, the resistance can be reduced by performing a heat treatment again at 700° C. or higher.

The results of the evaluation of the thus acquired $CoSi_2$ film or a $CoSi_2$ film under formation will be described below.

Figure 23C:
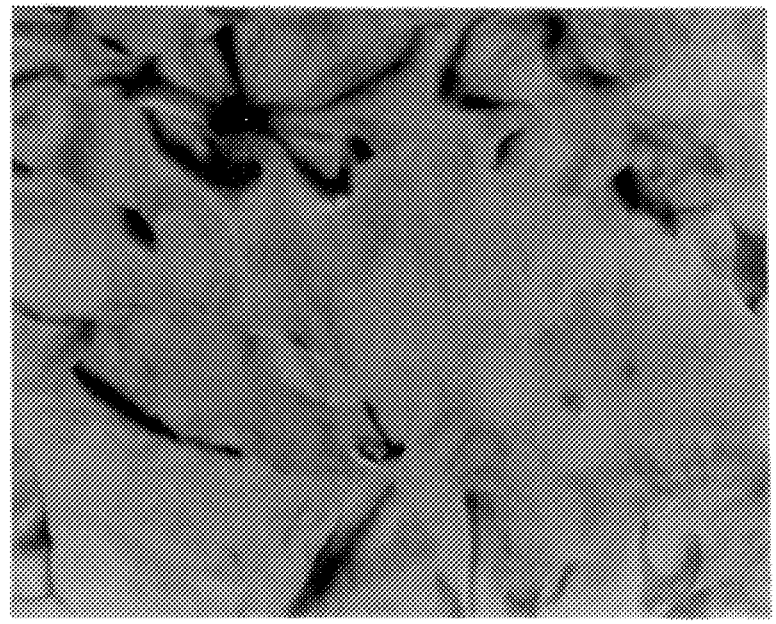

FIGS. 23A through 23C present plan TEM photographs showing how the grain size of the completed $CoSi_2$ film changes in accordance with different amounts of nitrogen (0%, 5% and 10%) added at the time of sputtering Co. It is apparent that as the amount of nitrogen increases, the grain size increases.

Figure 24A:
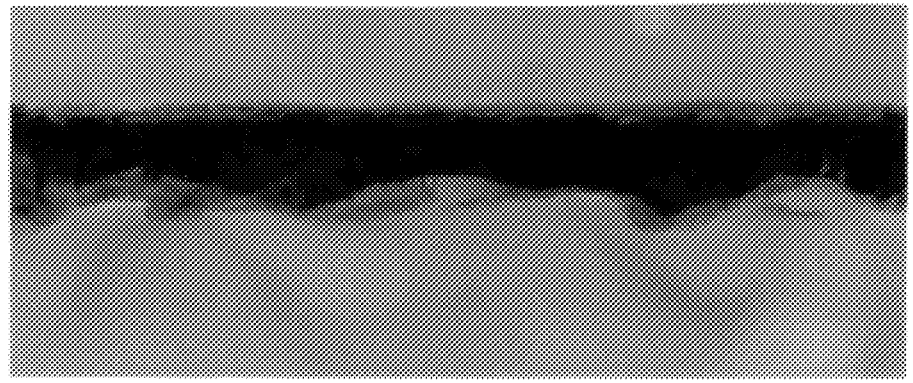
FIGS. 24A through 24C are cross-sectional TEM photographs of the interface between the cobalt silicide film according to the fourth embodiment and a source/drain diffusion layer, showing the undulations at the interface in the cases where the amounts of $N_2$ added during the film formation process are 0%, 5% and 10%.
Figure 24B:
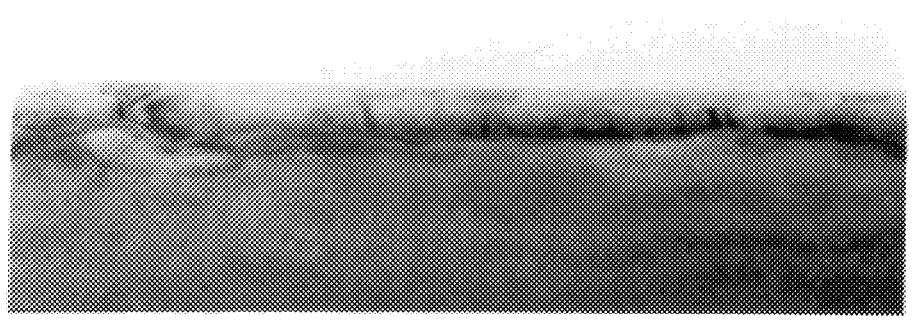
Figure 24C:
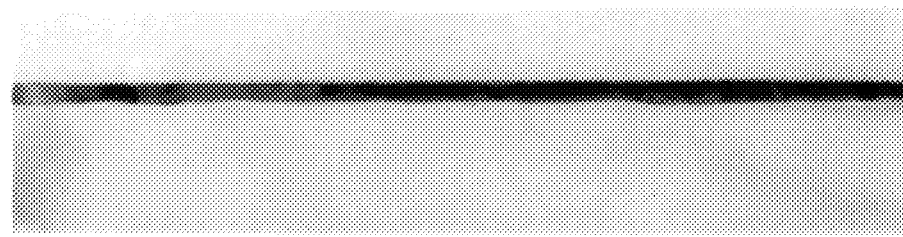

FIGS. 24A through 24C present plan TEM photographs showing how the undulation between the completed $CoSi_2$ film and the Si substrate changes in accordance with different amounts of nitrogen (0%, 5% and 10%) added at the time of sputtering Co. It is apparent that as the amount of nitrogen increases, the undulation becomes smaller. FIG. 25 illustrates the relationship between the amount of nitrogen and the roughness.

As the size of the undulation is small, the distance between the $CoSi_2$ film and the junction of the source/drain diffusion layer (the interface between the source/drain layer and the substrate) becomes longer so that the junction leak can be suppressed. It is apparent from the actual electric characteristics in FIGS. 26A through 26C that the leakage current at the junction is improved as the amount of nitrogen increases.

As the amount of nitrogen increases, the grain size increases (FIG. 27) and the resistivity decreases (FIG. 28). This phenomenon seems to have occurred due to the improvement on the crystallization of $CoSi_2$ with an increase in the amount of nitrogen. When the amount of nitrogen exceeds 10%, however, the sheet resistance rapidly increases (FIG. 29) because the thickness of the $CoSi_2$ film suddenly decreases. This reduction in the film thickness seems to have occurred because of the rapid suppression of the reaction of Co with Si when the amount of nitrogen increases to or above 10%. This phenomenon is also seen in the case of Ni.

Fifth Embodiment

A description will now be given of the case where the $CoSi_2$ film used in the fourth embodiment is adapted for use in an MOSFET. As the fabrication method of the fifth embodiment is similar to that of the second embodiment, this embodiment will be described referring to FIGS. 18A through 18F.

First, an element isolation region 32 surrounding an element forming region on the surface of a silicon substrate 31 is formed by LOCOS or the like, as shown in FIG. 18A. Thereafter, ion implantation in a channel region is performed, and then a gate oxide film 34 is formed by thermal oxidization after which polysilicon to be a gate electrode 33 is deposited as shown in FIG. 18B.

After the polysilicon is patterned to form the gate electrode 33, ions having the opposite conductivity to that of the substrate 31 are implanted into the substrate 31 with the gate electrode 33 as a mask to form a source/drain diffusion layer 36 which has an LDD structure. Then, an insulating film, for example, an $Si_3N_4$ film, is deposited on the entire substrate surface by LPCVD or the like, and then anisotropic etching such as RIE is carried out to form a gate sidewall insulating film 35.

Thereafter, ions for forming a highly doped source/drain diffusion layer 37 are implanted into the substrate 31. The implanted impurity is activated by thermal annealing, for example, RTA (Rapid Thermal Annealing), for 20 sec at 1000° C., thus forming the highly doped source/drain diffusion layer 37.

Next, the substrate is placed in one chamber of the sputtering device and the oxide film on the source/drain diffusion layer 37 and gate electrode 33 is removed by reverse sputtering in an Ar gas. Then, a metal film 39 of Co is formed in the same chamber by sputtering as shown in FIG. 18C. At this time, N is added to the Co deposition film by mixing 2.5 to 10% of an $N_2$ gas into the Ar gas in the sputtering device. The substrate is moved to another chamber without being exposed to air, and another metal film, e.g., a TiN film 40 is deposited on the metal film 39 by sputtering.

The resultant structure is subjected to thermal annealing under the Ar or $N_2$ environment for 30 sec at 400° to 500° C., for example, so that the Si surfaces of the source/drain diffusion layer 37 and the gate electrode 33 are transformed to a metal silicide ($CoSi_2$) film 41 as shown in FIG. 18D. At this time, Co on the element isolation region 32 and the gate sidewall insulating film 35 remains non-reacted.

Then, as shown in FIG. 18E, the non-reacted metal film 39 and TiN film 40 are selectively removed in a wet treatment using a mixed solution of sulfuric acid and hydrogen peroxide. This process allows the metal silicide ($CoSi_2$) film 41 to selectively remain on the surfaces of the source/drain diffusion layer 37 and the gate electrode 33. Because the resistance of the $CoSi_2$ film is high at this time, the resistance can be reduced by performing a heat treatment again under the condition of, for example, 700° C. or higher.

Then, an insulating film 42 is formed to 900 nm thick by, for example, normal pressure CVD and a contact hole is formed in the insulating film 42, as shown in FIG. 18F. Subsequently, an electrode material, such as Al—Si—Cu, is deposited by sputtering and is patterned to form an interconnection 43. When a double-layered interconnection or a triple-layered interconnection is required thereafter, another insulating film should be deposited, a via contact hole should be formed therein and an electrode material should be deposited and patterned.

Although the oxide film on the source/drain regions 36 and 37 and the gate electrode is removed by reverse sputtering prior to the deposition of the Co film in this embodiment, the oxide film may be removed by a dilute hydrofluoric acid treatment. Alternatively, the oxide film may be removed by using both processes.

Sixth Embodiment

A description will now be given of an example of forming a cobalt silicide film by ion implantation.

The fabrication method of this embodiment is the same as the fifth embodiment up to the process in FIG. 18B. Next, the oxide film on the source/drain diffusion layer 37 and the gate electrode 33 are removed by a dilute hydrofluoric acid treatment, and a metal film 39 of Co is deposited as shown in FIG. 18C in one chamber by the sputtering device. Before the sputtering of Co, the oxide film on Si may be removed by reverse sputtering of Ar. At this time, no $N_2$ gas is added to the Ar gas.

The substrate is moved to another chamber without being exposed to air, and another metal film, e.g., a TiN film 40 is deposited on the metal film 39 by sputtering. Thereafter, the substrate is removed from the chamber and a double-layered structure having TiN on Co is acquired. Under this situation, nitrogen ions are implanted into Co as shown in FIG. 30.

The resultant structure is subjected to thermal annealing under the Ar or $N_2$ environment for 30 sec at 500° C., for example, so that the Si surfaces of the source/drain diffusion layer 37 and the gate electrode 33 are transformed to a metal silicide ($CoSi_2$) film 41 as shown in FIG. 18D. At this time, Co on the element isolation region 32 and the gate side-wall insulating film 35 remains non-reacted.

Then, as shown in FIG. 18E, the non-reacted metal (Co) film 39 and TiN film 40 are selectively removed in a wet treatment using a mixed solution of sulfuric acid and hydrogen peroxide. This process allows the metal silicide ($CoSi_2$) film 41 to selectively remain on the surfaces of the source/drain diffusion layer 37 and the gate electrode 33. Because the resistance of the $CoSi_2$ film at this time is high, the resistance can be reduced by performing a heat treatment again under the condition of, for example, 700° C. or higher.

Although a metal is deposited on Co in the above-described embodiment of forming a cobalt silicide film, this metal should not necessarily be deposited.

Although the second, third, fifth and sixth embodiments discussed above are adapted for fabricating an MOSFET, the film forming method of this invention may be adapted to other semiconductor devices, such as a bipolar transistor, as well.

This invention can form a metal silicide film on the flat boundary with the silicon film or the like, and can provide a semiconductor device with a low-resistance film which has excellent oxidization resistance and heat resistance.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising the steps of:
   forming a first metal film including a first metal on a surface of a silicon layer by sputtering using a gas mixture comprising nitrogen gas, said first metal being nickel; and
   causing thermal reaction of said silicon layer with said metal film to form a monosilicide film of said first metal.

2. The method according to claim 1, wherein a ratio of said nitrogen gas in said gas mixture falls in a range of 2.5% to 10%.

3. The method according to claim 1, further comprising a step of forming a second metal film containing a second metal on a surface of said first metal film after said step of forming said first metal film.

4. The method according to claim 3, wherein said second metal is one selected from a group of Ti, W, $TiN_x$ and $WN_x$.

5. The method according to claim 1, wherein said step of forming said monosilicide film of said first metal is executed in an environment containing one of nitrogen and argon.

6. A method of manufacturing a semiconductor device comprising the steps of:
   forming a first metal film including a first metal on a surface of a silicon layer, said first metal being nickel;
   adding nitrogen to said first metal film by ion implantation; and
   causing thermal reaction of said silicon layer with said first metal film to form a monosilicide film of said first metal.

7. The method according to claim 6, further comprising a step of forming a second metal film containing a second metal on a surface of said first metal film after said step of forming said first metal film.

8. The method according to claim 7, wherein said second metal is one selected from a group of Ti, W, $TiN_x$ and $WN_x$.

9. The method according to claim 6, wherein said step of forming said monosilicide film of said first metal is executed in an environment containing one of nitrogen and argon.

10. A method of manufacturing a semiconductor device comprising the steps of:
    forming a gate insulating film and a gate electrode comprised of silicon on a surface of a silicon layer;
    forming source/drain diffusion layers on both sides of said gate electrode on said surface of said silicon layer;
    forming a first metal film including a first metal on surfaces of said source/drain diffusion layers and said gate electrode by sputtering using a gas mixture comprising nitrogen gas, said first metal being nickel;
    causing thermal reaction of said silicon layer and said silicon of said gate electrode with said first metal film to form monosilicide films of said first metal at interfaces where said source/drain diffusion layers and said gate electrode contact said first metal film; and
    removing non-reacted portions of said first metal film in said thermal reaction.

11. The method according to claim 10, wherein said gas mixture contains argon and nitrogen.

12. The method according to claim 10, wherein an amount of a nitrogen content in said gas mixture falls in a range of 2.5% to 10%.

13. The method according to claim 10, further comprising a step of forming a second metal film including a second metal on said first metal film after said step of forming said first metal film;
    wherein said step of removing said non-reacted portions of said first metal film includes a step of removing said second metal film.

14. The method according to claim 13, wherein said second metal is one selected from a group of Ti, W, $TiN_x$ and $WN_x$.

15. A method of manufacturing a semiconductor device comprising the steps of:
    forming a gate insulating film and a gate electrode comprised of silicon on a surface of a silicon layer;
    forming source/drain diffusion layers on both sides of said gate electrode on said surface of said silicon layer;
    forming a first metal film including a first metal on surfaces of said source/drain diffusion layers and said gate electrode by sputtering using a gas mixture comprising nitrogen gas, said first metal being nickel;
    adding nitrogen to said first metal film by ion implantation; and
    causing thermal reaction of said silicon layer and said silicon of said gate electrode with said first metal film to form monosilicide films of said first metal at interfaces where said source/drain diffusion layers and said gate electrode contact said first metal film.

16. The method according to claim 15, further comprising a step of forming a second metal film containing a second metal on said first metal film after said step of forming said first metal film.

17. The method according to claim 16, wherein said second metal is one selected from a group of Ti, W, $TiN_x$ and $WN_x$.

18. The method according to claim 1, wherein said step of causing thermal reaction comprises subjecting said silicon layer with said first metal film to a heat treatment at a temperature of 400° to 700° C.

19. The method according to claim 6, wherein said step of causing thermal reaction comprises subjecting said silicon layer with said first metal film to a heat treatment at a temperature of 400° to 700° C.

20. The method according to claim 10, wherein said step of causing thermal reaction comprises subjecting said silicon layer with said first metal film to a heat treatment at a temperature of 400° to 700° C.

21. The method according to claim 15, wherein said step of causing thermal reaction comprises subjecting said silicon layer with said first metal film to a heat treatment at a temperature of 400° to 700° C.

* * * * *